United States Patent [19]

Van Tran

[11] Patent Number: 5,089,789
[45] Date of Patent: Feb. 18, 1992

[54] DIFFERENTIAL AMPLIFIER

[75] Inventor: Hiep Van Tran, Carrollton, Tex.

[73] Assignee: Texas Instruments Incorporated, Dallas, Tex.

[21] Appl. No.: 524,404

[22] Filed: May 16, 1990

[51] Int. Cl.[5] .............................................. H03F 3/45
[52] U.S. Cl. .................................... 330/253; 307/300; 307/475; 330/257; 330/300
[58] Field of Search ............... 330/253, 257, 300, 260; 307/362, 300, 475

[56] References Cited

U.S. PATENT DOCUMENTS

| | | | |
|---|---|---|---|
| 3,399,357 | 8/1968 | Weilerstein | 330/260 |
| 3,527,961 | 9/1970 | Palini | 307/362 |
| 4,405,900 | 9/1983 | Van de Plassche | 330/253 X |
| 4,583,203 | 4/1986 | Monk | 307/475 X |
| 4,779,016 | 10/1988 | Sugiyama et al. | 307/475 |
| 4,904,952 | 2/1990 | Tanimoto | 330/261 |

OTHER PUBLICATIONS

Chang et al., "High Speed Comparator Circuit", *IBM Technical Disclosure Buletin*, vol. 27, No. 4A, Sep. 1984, pp. 1858-1859.

Hong et al., "Nonsaturating Logic Circuit", *IBM Technical Disclosure Bulletin*, vol. 14, No. 5, Oct. 1971, p. 1592.

*Primary Examiner*—James B. Mullins
*Attorney, Agent, or Firm*—James C. Kesterson; William E. Hiller; Richard L. Donaldson

[57] ABSTRACT

A differential amplifier includes first and second amplifying circuits for providing a differential output. Circuitry is provided to prevent forward-biasing of the transistors of the differential amplifiers.

18 Claims, 1 Drawing Sheet

DIFFERENTIAL AMPLIFIER

TECHNICAL FIELD OF THE INVENTION

This invention relates in general to integrated circuits, and more particularly to a differential amplifier.

BACKGROUND OF THE INVENTION

Differential amplifiers are used in many applications. One such application is to translate voltage levels from one logic type to another. For example, differential amplifiers may be used to translate from an ECL voltage level to a CMOS or TTL voltage level. Currently, many integrated circuits are designed to make use of different technologies, such as ECL, TTL, CMOS and BiCMOS, throughout a circuit. Hence, it is important to be able to quickly and accurately translate levels between circuits having different technologies.

Most differential amplifiers include a pair of transistors driven by respective input signals. If the transistors are NPN transistors, for example, the collectors of the transistors will be connected to $V_{CC}$ via a load, the bases will be connected to the respective input signals and the emitters will be connected to a common current source. The higher input signal will drive the respective transistor to draw more current, and hence, will reduce the voltage at its collector, as more current is drawn through the respective load. Often, a resistor is used as a load; however, a resistor will not provide a full voltage swing between the voltage rails. On the other hand, active load may be used to provide a full voltage swing, but these loads may result in the forward-biasing of the differential NPN transistors, which will slow the circuit.

Therefore, a need has arisen in the industry to provide a high speed differential amplifier which may be used in level translation, among other applications.

SUMMARY OF THE INVENTION

In accordance with the present invention, a differential amplifier is provided which substantially eliminates the disadvantages associated with prior differential amplifiers.

In the present invention, a differential amplifier comprises first and second differential amplifiers. The first differential amplifier generates first and second differential output signals responsive to first and second input signals. The second differential amplifier generates third and fourth differential output signals responsive to the first and second differential output signals generated by the first differential amplifier.

In one aspect of the present invention, the first differential amplifier comprises an MOS differential amplifier and the second differential amplifier comprises a bipolar differential amplifier. Circuitry is provided to prevent forward-biasing of the bipolar differential amplifiers transistors. Hence, the present invention provides a technical advantage over the prior art in that an active load may be used to provide the high voltage gain necessary to perform level translation, without the danger of the bipolar transistors entering saturation.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
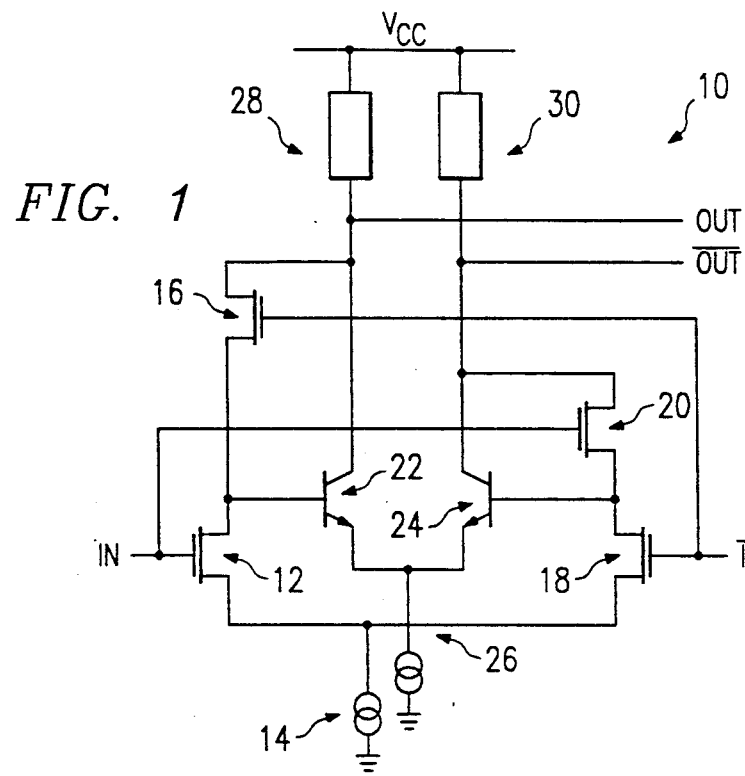
FIG. 1 illustrates a schematic representation of the differential amplifier of the present invention.
Figure 2:
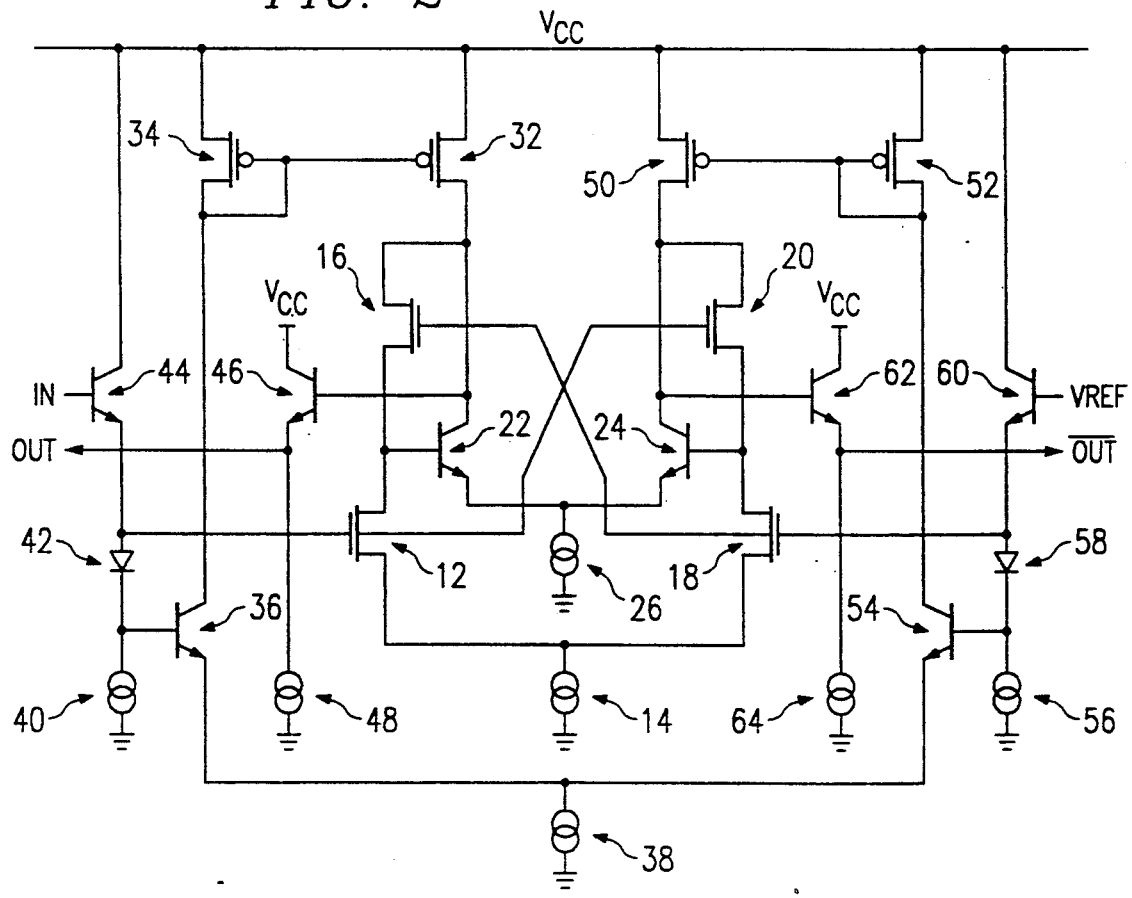
FIG. 2 illustrates a ECL-to-BiCMOS level translator using the differential amplifier of FIG. 1.

The preferred embodiment of the present invention is best understood by referring to FIGS. 1-2 of the drawings, like numerals being used for like and corresponding parts of the various drawings.

FIG. 1 illustrates a schematic representation of a differential amplifier 10 according to the present invention. A preamplifier circuit comprises an NMOS transistor 12 having a gate connected to the IN signal, a source connected to current source 14 and a drain connected to the source of N-channel transistor 16. N-channel transistor 18 has a source connected to current source 14, a gate connected to the $\overline{IN}$ and a drain connected to the source of N-channel transistor 20. An inner differential amplifier comprises NPN transistors 22 and 24 having emitters connected to a current source 26 and collectors connected to the drains of N-channel transistors 16 and 20 and to resistors 28 and 30. The opposite ends of resistors 28 and 30 are connected to $V_{CC}$. The OUT signal is connected to the collector of transistor 22 and in the $\overline{OUT}$ signal is connected to the collector of transistor 24.

In the preferred embodiment, loads 28 and 30 are preferably active loads. An implementation of an active load is illustrated in connection with FIG. 2.

In operation, the differential amplifier 10 performs as follows. The IN and $\overline{IN}$ signals will be supplied by a circuit external to the differential amplifier 10. Typically, the IN and $\overline{IN}$ signals are complements of one another; however, they need not be related. For example, the $\overline{IN}$ signal could be a voltage reference signal against which the logic level of the IN signal is compared. The OUT and $\overline{OUT}$ signals are amplified versions of the IN and $\overline{IN}$ signals, respectively.

If the IN signal has a voltage greater than the $\overline{IN}$ signal, then transistor 12 will be turned on harder than transistor 18, thereby drawing a larger proportion of the current through current source 14. Transistors 16 and 20 act as loads for transistors 12 and 18, respectively. Hence, the voltage at the base of transistor 22 will be less than the voltage at the base of transistor 24. The signals at the base of transistors 22 and 24 can therefore be thought of as the outputs of the preamplifier section.

In the above example, the higher voltage at the base of the transistor 24 will drive more current than will the voltage at the base of transistor 22. Hence, the voltage at the collector of transistor 24 (and hence at the $\overline{OUT}$ signal) will be less than the voltage on the collector of transistor 22 (the OUT signal).

In the preferred embodiment, loads 28 and 30 are active loads, which provide a full voltage swing between the power rails ($V_{CC}$ and ground). However, using active loads, it is possible that the voltage at the collector of one of the NPN transistors 22 or 24 could be greater than the voltage on the respective base. Thus, both the collector-base and base-emitter voltages would be forward-biased, and the transistor would be in saturation. This is undesirable because of the significantly lower speed of a transistor in saturation.

In the preferred embodiment illustrated in FIG. 1, however, the collector-base junction of either bipolar transistor cannot become forward-biased, because of the MOS transistors 16 and 20. If the IN signal is high, causing a low voltage on the collector of the bipolar transistor 24, the N-channel transistor 20 will also be enabled, thereby lowering the base potential until an equilibrium is reached. Similarly, if the $\overline{\text{IN}}$ signal is high, N-channel transistor 16 will be enabled, thereby lowering the base voltage of the NPN transistor 22. Consequently, N-channel transistor 20 act not only as a load for the differential preamplifier transistors 12 and 18, but also prevent forward-biasing of the NPN transistors 22 and 24.

FIG. 2 illustrates an embodiment of the present invention used in an input buffer/level translator which inputs standard ECL signals and converts to BiCMOS signals. A P-channel transistor 32 has its source connected to $V_{CC}$, its gate connected to the gate and drain of P-channel transistor 34 and its drain connected to the source of N-channel transistor 16 and to the collector of NPN transistor 22. P-channel transistor 34 has its source connected $V_{CC}$ and its drain connected to the collector of NPN channel transistor 36. NPN transistor 36 has an emitter connected to current source 38 and a base connected to a current source 40 and to the cathode of a diode 42. The IN signal is connected to the base of NPN transistor 44 which has an emitter connected to the anode of diode 42 and to the gates of N-channel transistors 12 and 20. The collector of NPN transistor 44 is connected to $V_{CC}$. NPN transistor 46 has a collector connected to $V_{CC}$, an emitter connected to current source 48 and to the OUT signal, and a base connected to the collector of transistor 22 and to the drain of P-channel transistor 32.

P-channel transistor 50 has a source connected to $V_{CC}$, a drain connected to the source of N-channel transistor 20 and to the collector of NPN transistor 24. The gate of transistor 50 is connected to the gate and drain of P-channel transistor 52. The source of P-channel transistor 52 is connected to $V_{CC}$. The drain of P-channel transistor 52 is also connected to the collector of NPN transistor 54. The emitter of transistor 54 is connected to current source 38, and the base of transistor 54 is connected to current source 56 and to the cathode of diode 58. The $V_{ref}$ signal is connected to the base of NPN transistor 60. The emitter of NPN transistor 60 is connected to the anode of diode 58, the gate of transistor 18 and the gate of transistor 16. The collector of NPN transistor 60 is connected to $V_{CC}$. NPN transistor 62 has a base connected to the collector of NPN transistor 24, a collector connected to $V_{CC}$, and an emitter connected to current source 64. The $\overline{\text{OUT}}$ signal is taken from the emitter of transistor 62.

In operation, the P-channel transistors 32 and 34 form a current mirror which acts as an active load for NPN transistor 22. Transistor 36 serves as the push-pull load for the PMOS transistors. Similarly, P-channel transistors 50 and 52, along with NPN transistor 54, act as an active load for NPN transistor 24. Transistors 46 and 62 are emitter-followers for driving the output signals OUT and $\overline{\text{OUT}}$. Transistors 44 and 60 are emitter-follower transistors providing an input buffer.

The $V_{ref}$ signal is the threshold with which determines whether the IN signal is a logic high or logic low. If the IN signal is higher than the $V_{ref}$ signal, transistor 12 will driven harder than transistor 18, resulting in the voltage at the base of transistor 22 being lower than the voltage at the base of transistor 24. Consequently, the voltage at the collector of transistor 24 will be lower than the voltage at the collector of transistor 22 and the $\overline{\text{OUT}}$ signal will be lower than the OUT signal. Typically, the OUT signal would, in this example, be approximately five volts and the $\overline{\text{OUT}}$ signal would be approximately zero volts.

Conversely, if the IN signal is less than the $V_{ref}$ signal, the voltage at the collector at the NPN transistor 24 will be less than the voltage at the collector at transistor 22. Consequently, the OUT signal will be at approximately zero volts and the $\overline{\text{OUT}}$ signal will be at approximately five volts.

Although the present invention has been described in detail, it should be understood that various changes, substitutions and alterations can be made herein without departing from the spirit and scope of the invention as defined by the appended claims.

What is claimed is:

1. A differential amplifier comprising:
   a first differential amplifier for generating first and second differential output signals responsive to first and second input signals, said first differential amplifier comprising at least first and second MOS transistors;
   a second differential amplifier coupled to said first differential amplifier for generating third and fourth differential output signals responsive to said first and second differential output signals, said second differential amplifier comprising at least third and fourth bipolar transistors; and
   fifth and sixth transistors driven responsive to said first and second input signals, said fifth and sixth transistors coupled to said first and second transistors to act as loads for said first differential amplifier, wherein said fifth transistor is coupled to said third transistor and said sixth transistor is coupled to said fourth transistor to provide feedback to said second differential amplifier.

2. The differential amplifier of claim 1 wherein said fifth and sixth transistors are coupled to prevent the collector-base junction of said third and fourth bipolar transistors from becoming forward biased.

3. The differential amplifier of claim 2 wherein said fifth and sixth transistors comprise MOS transistors driven responsive to said input signals.

4. The differential amplifier of claim 1 wherein each bipolar transistor has an active load coupled to its collector.

5. The differential amplifier of claim 4 wherein said active loads each comprise a pair of p-channel transistors forming a current mirror.

6. A circuit for translating an input signal from a first set of logic levels to a second set of logic levels comprising:
   a voltage source for providing a reference voltage;
   a first differential amplifier coupled to the input signal and the reference voltage for generating first and second differential output signals responsive to the voltage differential between the input signal and the reference voltage, said first differential amplifier comprising at least first and second MOS transistors;
   a second differential amplifier coupled to said first differential amplifier for generating third and fourth differential output signals responsive to said first and second differential output signals, said second differential amplifier comprising at least third and fourth bipolar transistors; and
   fifth and sixth transistors driven responsive to said first and second input signals, said fifth and sixth transistors coupled to said first and second transistors to act as loads for said first differential amplifier, wherein said fifth transistor is coupled to said third transistor and said sixth transistor is coupled to said fourth transistor to provide feedback to said second differential amplifier.

7. The differential amplifier of claim 6 wherein said fifth and sixth transistors are coupled to prevent the collector-base junction of said bipolar transistors from becoming forward biased.

8. The differential amplifier of claim 7 wherein said fifth and sixth transistors comprise MOS transistors driven responsive to said input signals.

9. The differential amplifier of claim 6 wherein each bipolar transistor has an active load coupled to its collector.

10. The differential amplifier of claim 9 wherein said active loads each comprise a pair of p-channel transistors forming a current mirror.

11. A method of amplifying the voltage difference between two input signals comprising the steps of:
pre-amplifying the voltage difference between the input signals with a first MOS differential amplifier to generate first and second differential signals;
amplifying the voltage difference between said first and second differential signals with a second bipolar differential amplifier to generate third and fourth differential signals wherein said second differential amplifier includes first and second bipolar transistors each coupled to an active load; and
providing feedback to said second differential amplifier with an active load coupled to said first and second differential amplifier.

12. The method of claim 11 wherein said step of providing feedback comprises the step of preventing the collector-base junctions of the bipolar transistors from becoming forward biased.

13. The method of claim 12 wherein said preventing step comprises selectively enabling a MOS transistor coupled between the base and collector of each bipolar transistor such that the base voltage remains below the collector voltage.

14. A differential amplifier for amplifying first and second input signals comprising:
first, second, third, fourth, fifth, and sixth transistors; and
first and second active loads connected to a voltage source,
wherein:
said first input signal is connected to control terminals of said first and fourth transistors;
said second input signal is connected to control terminals of said second and third transistors;
a first terminal of each of said first, second, fifth and sixth transistors are connected to ground;
a second terminal of said first transistor is connected to a control terminal of said fifth transistor and to a first terminal of said third transistor;
a second terminal of said second transistor is connected to a control terminal of said sixth transistor and to a first terminal of said fourth transistor;
a second terminal of said fifth transistor is connected to a second terminal of said third transistor and to said first active load; and
a second terminal of said sixth transistor is connected to a second terminal of said fourth transistor and to said second active load.

15. The differential amplifier of claim 14 wherein said active loads comprise a pair of p-channel transistors forming a current mirror.

16. The amplifier of claim 14 wherein said first and second transistors are MOS transistors and wherein said first terminal is the source, said second terminal is the drain, and said control terminal is the gate.

17. The amplifier of claim 14 wherein said third and fourth transistors are MOS transistors and wherein said first terminal is the source, said second terminal is the drain, and said control terminal is the gate.

18. The amplifier of claim 14 wherein said fifth and sixth transistors are bipolar transistors and wherein said first terminal is the emitter, said second terminal is the collector, and said control terminal is the base.

* * * * *